United States Patent
Zinn et al.

(10) Patent No.: US 9,666,750 B2
(45) Date of Patent: May 30, 2017

(54) PHOTOVOLTAIC CELLS HAVING ELECTRICAL CONTACTS FORMED FROM METAL NANOPARTICLES AND METHODS FOR PRODUCTION THEREOF

(71) Applicant: LOCKHEED MARTIN CORPORATION, Bethesda, MD (US)

(72) Inventors: Alfred A. Zinn, Palo Alto, CA (US); Andrew Fried, Saint Paul, MN (US); Sidney Hu, Sunnyvale, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/720,695

(22) Filed: May 22, 2015

(65) Prior Publication Data

US 2015/0255663 A1  Sep. 10, 2015

Related U.S. Application Data

(62) Division of application No. 13/764,667, filed on Feb. 11, 2013, now abandoned.
(Continued)

(51) Int. Cl.
*H01L 31/18* (2006.01)
*H01L 31/0224* (2006.01)
(Continued)

(52) U.S. Cl.
CPC .......... *H01L 31/1804* (2013.01); *H01B 1/22* (2013.01); *H01L 21/288* (2013.01);
(Continued)

(58) Field of Classification Search
CPC ...................... H01L 31/022425; H01L 21/288
See application file for complete search history.

(56) References Cited

U.S. PATENT DOCUMENTS 3,332,916 A  7/1967  Hay
3,637,508 A  1/1972  Willsey et al.
(Continued)

FOREIGN PATENT DOCUMENTS

EP  1921176 A2  5/2008
JP  H 01-168073 A  7/1989
(Continued)

OTHER PUBLICATIONS

Jhon L. Cuya Huaman, Kimitaka Sato, Satoshi Kurita, Takatoshi Matsumotoc and Balachandran Jeyadevan, Copper nanoparticles synthesized by hydroxyl ion assisted alcohol reduction for conducting ink, J. Mater. Chem., 2011, 21, 7062-7069.*
(Continued)

*Primary Examiner* — Victor A Mandala
*Assistant Examiner* — Regan J Rundio
(74) *Attorney, Agent, or Firm* — McDermott Will & Emery LLP

(57) ABSTRACT

Photovoltaic cells having copper contacts can be made by using copper nanoparticles during their fabrication. Such photovoltaic cells can include a copper-based current collector located on a semiconductor substrate having an n-doped region and a p-doped region. The semiconductor substrate is configured for receipt of electromagnetic radiation and generation of an electrical current therefrom. The copper-based current collector includes an electrically conductive diffusion barrier disposed on the semiconductor substrate and a copper contact disposed on the electrically conductive diffusion barrier. The copper contact is formed from copper nanoparticles that have been at least partially fused together. The electrically conductive diffusion barrier limits the passage of copper therethrough.

18 Claims, 8 Drawing Sheets

Related U.S. Application Data

(60) Provisional application No. 61/597,680, filed on Feb. 10, 2012.

(51) Int. Cl.
 *H01L 21/288* (2006.01)
 *H01B 1/22* (2006.01)
 *B05D 3/02* (2006.01)
 *H01L 31/0216* (2014.01)
 *B82Y 40/00* (2011.01)
 *B82Y 30/00* (2011.01)

(52) U.S. Cl.
 CPC ............... *H01L 31/02167* (2013.01); *H01L 31/022425* (2013.01); *H01L 31/18* (2013.01); *H01L 31/1864* (2013.01); *B82Y 30/00* (2013.01); *B82Y 40/00* (2013.01); *Y02E 10/50* (2013.01)

(56) References Cited

U.S. PATENT DOCUMENTS

| | | |
|---|---|---|
| 3,896,491 A | 7/1975 | Soehring |
| 5,147,841 A | 9/1992 | Wilcoxon |
| 5,159,171 A | 10/1992 | Cook et al. |
| 5,358,546 A | 10/1994 | Rieke |
| 6,143,356 A | 11/2000 | Jablonski |
| 6,346,189 B1 | 2/2002 | Dai et al. |
| 6,645,444 B2 | 11/2003 | Goldstein |
| 6,660,058 B1 | 12/2003 | Oh et al. |
| 6,783,569 B2 | 8/2004 | Cheon et al. |
| 7,306,823 B2 | 12/2007 | Sager et al. |
| 7,339,110 B1 | 3/2008 | Mulligan et al. |
| 7,419,887 B1 | 9/2008 | Quick et al. |
| 7,442,879 B2 | 10/2008 | Das et al. |
| 7,524,351 B2 | 4/2009 | Hua et al. |
| 7,559,970 B2 | 7/2009 | Kim et al. |
| 7,628,840 B2 | 12/2009 | Atsuki et al. |
| 7,637,982 B2 | 12/2009 | Hou et al. |
| 7,736,414 B1 | 6/2010 | Zinn |
| 7,780,758 B2 | 8/2010 | Park et al. |
| 7,847,397 B2 | 12/2010 | Wu et al. |
| 7,850,933 B2 | 12/2010 | Yang et al. |
| 7,858,025 B2 | 12/2010 | Shim et al. |
| 8,545,731 B2 * | 10/2013 | Kim ............... B82Y 10/00 174/250 |
| 8,884,159 B2 * | 11/2014 | Huang ............ H01L 31/022425 136/265 |
| 9,184,333 B2 * | 11/2015 | Parikh ............. H01L 31/022425 |
| 2004/0087441 A1 | 5/2004 | Bock et al. |
| 2004/0253174 A1 | 12/2004 | Williams |
| 2005/0129580 A1 | 6/2005 | Swinehart et al. |
| 2005/0249967 A1 | 11/2005 | Egli |
| 2006/0046447 A1 | 3/2006 | Yamamoto |
| 2006/0083694 A1 | 4/2006 | Kodas et al. |
| 2007/0031722 A1 | 2/2007 | Adzic et al. |
| 2007/0169806 A1 | 7/2007 | Fork et al. |
| 2007/0202304 A1 | 8/2007 | Golovko et al. |
| 2007/0269991 A1 | 11/2007 | Jang et al. |
| 2007/0290175 A1 | 12/2007 | Kim |
| 2007/0298536 A1 | 12/2007 | Ren et al. |
| 2008/0003364 A1 | 1/2008 | Ginley et al. |
| 2008/0011125 A1 | 1/2008 | Shirata et al. |
| 2008/0032132 A1 | 2/2008 | Woodfield et al. |
| 2008/0044657 A1 | 2/2008 | Woo et al. |
| 2008/0072706 A1 | 3/2008 | Lee et al. |
| 2008/0124268 A1 | 5/2008 | Yang et al. |
| 2008/0128268 A1 * | 6/2008 | Lopatin ............... C25D 5/022 204/192.1 |
| 2008/0149176 A1 | 6/2008 | Sager et al. |
| 2008/0151515 A1 | 6/2008 | Das et al. |
| 2008/0159902 A1 | 7/2008 | Shim et al. |
| 2008/0230750 A1 | 9/2008 | Gillies et al. |
| 2008/0278181 A1 | 11/2008 | Zhong et al. |
| 2009/0029148 A1 | 1/2009 | Hashimoto et al. |
| 2009/0039513 A1 | 2/2009 | Fath et al. |
| 2009/0072013 A1 | 3/2009 | Natekar et al. |
| 2009/0145765 A1 | 6/2009 | Abys et al. |
| 2009/0214764 A1 | 8/2009 | Li et al. |
| 2009/0239073 A1 | 9/2009 | Huang et al. |
| 2009/0285976 A1 | 11/2009 | Lochtman et al. |
| 2009/0301606 A1 | 12/2009 | Ueshima |
| 2010/0065616 A1 | 3/2010 | Zinn |
| 2010/0075137 A1 | 3/2010 | Sinton et al. |
| 2010/0139455 A1 | 6/2010 | Tilley et al. |
| 2010/0275729 A1 | 11/2010 | Jun et al. |
| 2010/0314578 A1 | 12/2010 | Purdy |
| 2011/0074040 A1 * | 3/2011 | Frank ............... H01L 21/288 257/774 |
| 2011/0284070 A1 * | 11/2011 | Suzuki ............. H01L 31/02013 136/256 |
| 2011/0315217 A1 * | 12/2011 | Gee ................... H01B 1/20 136/256 |
| 2012/0000523 A1 | 1/2012 | Park et al. |
| 2012/0220072 A1 * | 8/2012 | Kim .................. H01B 1/22 438/98 |
| 2013/0065351 A1 * | 3/2013 | Baker-O'Neal H01L 31/022425 438/72 |
| 2013/0125968 A1 * | 5/2013 | Sinha ............. H01L 31/022433 136/256 |

FOREIGN PATENT DOCUMENTS

| | | |
|---|---|---|
| WO | WO-2005/065100 A2 | 7/2005 |
| WO | WO-2006/063134 A2 | 6/2006 |
| WO | WO-2008023944 | 2/2008 |
| WO | WO-2009/085342 | 7/2009 |
| WO | WO-2009/115643 A2 | 9/2009 |
| WO | WO-2010/036114 A2 | 4/2010 |

OTHER PUBLICATIONS

Choi, Yun-Hyuk, et al. "Highly conductive polymer-decorated Cu electrode films printed on glass substrates with novel precursor-based inks and pastes." Journal of Materials Chemistry 22.8 (2012): 3624-3631.*
Aslam, et al., "Formulation of CU and Cu2O Nanoparticles by Variation of the Surface Ligand: Preparation, Structure and Insulating-to-Metallic Transition," Journal of Colloid and Interface Science 2002, pp. 79-90.
Balan, et al., "A new organometallic synthesis of size-controlled tin(0) nanoparticles," Nanotechnology vol. 16, pp. 1153-1158 (May 17, 2005).
Balan, et al., "Novel low-temperature synthesis of tin(0) nanoparticles," Materials Letters 59, pp. 1080-1084 (2005).
Chu, et al., "Thermal Aqueous Solution Approach for the Synthesis of Triangular and Hexagonal Gold nanoplates with Three Different Size Ranges," Inorganic Chemistry 2006, pp. 808-813, vol. 45.
Ding et al., "Nucleation and Growth of Single-Walled Carbon Nanotubes: A Molecular Dynamics Study", J. Phys. Chem. B, (2004), pp. 17369-17377, vol. 108, American Chemical Society.
Foresti, et al., "New Thiophene Monolayer Protected Copper Nanoparticles: Synthesis and Chemical-Physical Characterization", Department of Chemistry "G. Ciamician" Alma Mater Studiorum Bologna University.
Gupta, Synthesis of Metallic Nanoparticles and Their Applications, Department of Research and Advanced Studies of the University of Cincinnati 2006.
Hsu, et al., "Nanostructures of Sn and Their Enhanced, Shape-Dependent Superconducting Properties," Smakll 2006, pp. 268-273, vol. 2, No. 2.
Jiang, et al., "Size-Dependent Melting Properties of Tin Nanoparticles", Chemical Physics Letters, 2006, pp. 492-496, vol. 429, Science Direct.
Kang, et al., "Inkjet Printed Electronics Using Copper Nanoparticle Ink," J Mater Sci: Mater Electron 2010, vol. 21, pp. 1213-1220.
Kanninen, et al., "Influence of Ligand Structure on the Stability and Oxidation of Copper Nanoparticles", Journal of Colloid and Interface Science 318 (2008) pp. 88-95.

(56) References Cited

OTHER PUBLICATIONS

Kogiso, et al., "One-Dimensional Organization of Copper Nanoparticles by Chemical Reduction of Lipid-Copper Hybrid Nanofibers", The Royal Society of Chemistry 2002, pp. 2492-2493.
Kwon, et al., "Effect of Capping Agents in Tin Nanoparticles on Electrochemical Cycling," Electrochemical nad Solid-State Letters 2006, pp. A34-SA38, vol. 9, No. 1.
Lin, et al., "The influence of nano-particles on microstructureal development at the interface of Sn3.5Ag-solder and Cu-substrate," Int J Nanomanufacturing, 2007 vol. 1, No. 3.
Lisiecki, et al., "Control of the Shape and the Size of Copper Metallic Particles", J. Phys. Chem 1996, 100, pp. 4160-4166.
Magdassi, et al., "Copper Nanoparticles for Prined Electronics: Routes Towards Achieving Oxidation Stability," Materials 2010, vol. 3, pp. 4626-4638.
Masala, et al., "Synthesis Routes for Large Volumes of Nanoparticles," Annu Rev Mater Res 2004, pp. 41-81.
Mirjalili, et al. "Prediction of Nanoparticles' Size-Dependent Melting Temperature Using Mean Coordination Number Concept," Journal of Physics and Chemistry of Solids, 2008, pp. 2116-2123, 69.
Mott, et al., "Synthesis of Size-Controlled and Shaped Copper Nanoparticles", Langmuir 2007, 23, pp. 5740-5745.
Oncel et al., "Carbon Nanotube Synthesis via the Catalytic CVD Method: A Review on the Effect of Reaction Parameters", Fullerenes, Nanotubes, and Carbon Nanostructures, (2006), pp. 17-37, vol. 14, Taylor & Francis Group, LLC.
Product Description—"Copper Nanoparticle, Cu", NaBond Technologies Co., Ltd. 2001-2009.
Product Description—"Copper Nanoparticles", American Elements 2001-2010.
Product Description—"Nano-Copper", Sun Innovations, Inc. 2005-2010.
Product Description—"Nanopowders" Sigma-Aldrich 2010.
Product Description—"Powders: Nanoparticles & Nanopowders", SkySpring Nanomaterials, Inc.
Product Description—Copper Nanoparticle (Copper Nanopowder), Suzhou Canfuo Nano Technology Co., Ltd. 1997-2011.
Pulkkinen, et al., "Poly(ethylene imine) and Tetraethylenepentamine as Protecting Agents for Metallic Copper Nanoparticles", Applied Materials & Interfaces, (2009) vol. 1, No. 2, pp. 519-525.

Ritschel et al., "Rhenium-Catalyzed Growth Carbon Nanotubes", J. Phys. Chem. C, (2007), pp. 8414-8417, vol. 111, American Chemical Society.
Shandiz, "Effective Coordination Number Model for the Size Dependency of Physical Properties of Nanocrystals," Journal of Physics: Condensed Matter, 2008, pp. 1-9, 20, IOP Publishing.
Wang, et al,, "Poly(allylamine)-Stabilized Colloidal Copper Nanoparticles: Synthesis, Morphology and Their Surface-Enhanced Raman Scattering Properties," Langmuir Article 2010, vol. 26, No. 10, pp. 7469-7474.
Wu, et al., "One-Step Green Route to Narrowly Dispersed Copper Nanocrystals", Journal of Nanoparticle Research (2006) pp. 965-969.
Wu, et al., "Simple One-Step Synthesis of Uniform Disperse Copper Nanoparticles", Mater. Res. Soc. Symp, Proc. 2005, vol. 879E, pp. Z6.3.1-Z6.3.6.
Yang, et al., "Synthesis and Characterization of Sn/R, Sn/Si-R, and $Sn/SiO_2$ Core/Shell Nanoparticles," Chem. Mater, vol. 12, No. 4, pp. 983-988 (2000).
Yeshchenko, et al., "Size-Dependent Melting of Spherical Copper Nanoparticles Embedded in a Silica Matrix", Physical Review B 75 (2007), pp. 085434-1 to 085434-6.
Yonezawa, et al., "The Preparation of Copper Fine Particle Paste and Its Application as the Inner Electrode Material of a Multilayered Ceramic Capacitor", Nanotechnology 19 (2008) 145706, pp. 1-5.
Zhao, et al., "Preparation of tin nanoparticles by solution dispersion," Materials Science and Engineering, vol. A359, pp. 405-407 (May 2003).
Gunes, et al., "Conjugated Polymer-Based Organic Solar Cells," Chem Rev 2007, 107, 1324-1338.
Khadilkar, et al., "Characterization of Al Back Contact in a Silicon Solar Cell," Presented at the International PCSEC-15, Shanghai China 2005.
Chen, et al "Oxidation Resistance of Graphene-Coated Cu and Cu/Ni Alloy," ACS Nano, 5, Jan. 28, 2011, p. 1321-1327.
Lee, et al., "The Evolution of Diffusion Barriers in Copper Metallization," Journal of the Minerals, Metals and Materials Society, Jan. 2007, pp. 44-49.
Bartsch, et al., "Quick Determination of Copper-Metallization Long-Term Impact on Silicon Solar Cells," Journal of the Electrochemical Society, Aug. 2010, vol. 157, No. 10, pp. H942-H946.

* cited by examiner

PHOTOVOLTAIC CELLS HAVING ELECTRICAL CONTACTS FORMED FROM METAL NANOPARTICLES AND METHODS FOR PRODUCTION THEREOF

CROSS-REFERENCE TO RELATED APPLICATIONS

This application is a divisional of U.S. patent application Ser. No. 13/764,667, filed on Feb. 11, 2013, now abandoned, which claims the benefit of priority under 35 U.S.C. §119 from U.S. Provisional Patent Application 61/597,680, filed on Feb. 10, 2012, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to photovoltaic cells, and, more specifically, to photovoltaic cells formed from nanoparticles.

BACKGROUND

With growing consumer demands for energy, especially clean energy derived from renewable resources, photovoltaic devices (i.e., solar cells) have garnered increased interest and are becoming much more widely deployed in spite of their high cost. Silicon-based photovoltaic cells currently dominate the global photovoltaics market and are projected to continue to do so for the foreseeable future, with an estimated revenue growth of 10-25% taking place over the next 10 years. As a result of the expense of most photovoltaic cells, the photovoltaics industry is under tremendous pressure to cut costs, which can be a primary driver for a product's success in the marketplace. In many commercial applications, cost can outrank even a photovoltaic cell's performance and photon conversion efficiency.

Materials constitute a large portion of the total cost of silicon-based photovoltaic cells, and these costs are continuing to rise. The expense of high purity silicon is the leading cost driver for silicon-based photovoltaic cells. Alternative semiconductor materials are available, but they are also very expensive. The silver paste used to form electrical connections in conventional silicon-based photovoltaic cells ranks a close second behind silicon in terms being a cost driver. Silver prices have steadily increased and become quite volatile over the past several years, and there are limited opportunities to increase global silver production capacity. Despite these issues, there are currently no low cost alternative materials that can suitably replace silver in silicon-based photovoltaic cells, at least without necessitating significant changes to their manufacturing process.

During the fabrication of many conventional silicon-based photovoltaic cells, silver paste is applied to the top surface of the cell and converted into current collectors by a high temperature processing step (>800° C.). The high temperature processing step facilitates a glass frit etch of a SiN antireflective coating on the substrate, such that the silver can make electrical contact with the semiconductor. However, the micron-scale silver particles within the silver paste do not melt or become fused together with one another during the high temperature processing step. Instead, electrical conduction is established through grain-to-grain contact of the silver particles, thereby decreasing the obtainable electrical conductivity. The high temperature processing step also places significant restrictions on the types of materials that can be used prior to that operation. Thermally stable substrates capable of withstanding the processing temperatures of silver paste can also significantly add to the cost of current photovoltaic cells.

One of the most desirable features of silver in regard to the manufacturing of photovoltaic cells is its high electrical conductivity. Although other metals can display similar electrical properties, silver paste is still more readily processed than are any potential replacement bulk metals, thereby compensating for its high cost. Of potential metallic replacements for silver, copper presents particular advantages due to its similar electrical conductivity, much lower cost, and relatively low price volatility. By utilizing copper in place of silver in photovoltaic cells, material costs could be reduced by as much as 10%. However, copper presents particular challenges as a direct replacement for silver that have not allowed this change to be made.

Although photovoltaic cells having copper-based current collectors have the potential to fulfill an unmet need in the art, satisfactory means for fabricating such photovoltaic cells have yet to be developed. The present invention satisfies the foregoing need and provides related advantages as well.

SUMMARY

In some embodiments, the present disclosure describes photovoltaic cells including a copper-based current collector located on a semiconductor substrate having an n-doped region and a p-doped region. The semiconductor substrate is configured for receipt of electromagnetic radiation and generation of an electrical current therefrom. The copper-based current collector includes an electrically conductive diffusion barrier disposed on the semiconductor substrate and a copper contact disposed on the electrically conductive diffusion barrier. The copper contact is formed from copper nanoparticles that have been at least partially fused together. The electrically conductive diffusion barrier limits the passage of copper therethrough.

In some embodiments, the present disclosure describes methods for forming photovoltaic cells. The methods include applying an electrically conductive diffusion barrier onto a semiconductor substrate having an n-doped region and a p-doped region, applying copper nanoparticles onto the electrically conductive diffusion barrier, and heating the copper nanoparticles to a temperature sufficient to at least partially fuse the copper nanoparticles together, thereby forming a copper contact on the electrically conductive diffusion barrier. The electrically conductive diffusion barrier limits the passage of copper therethrough.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
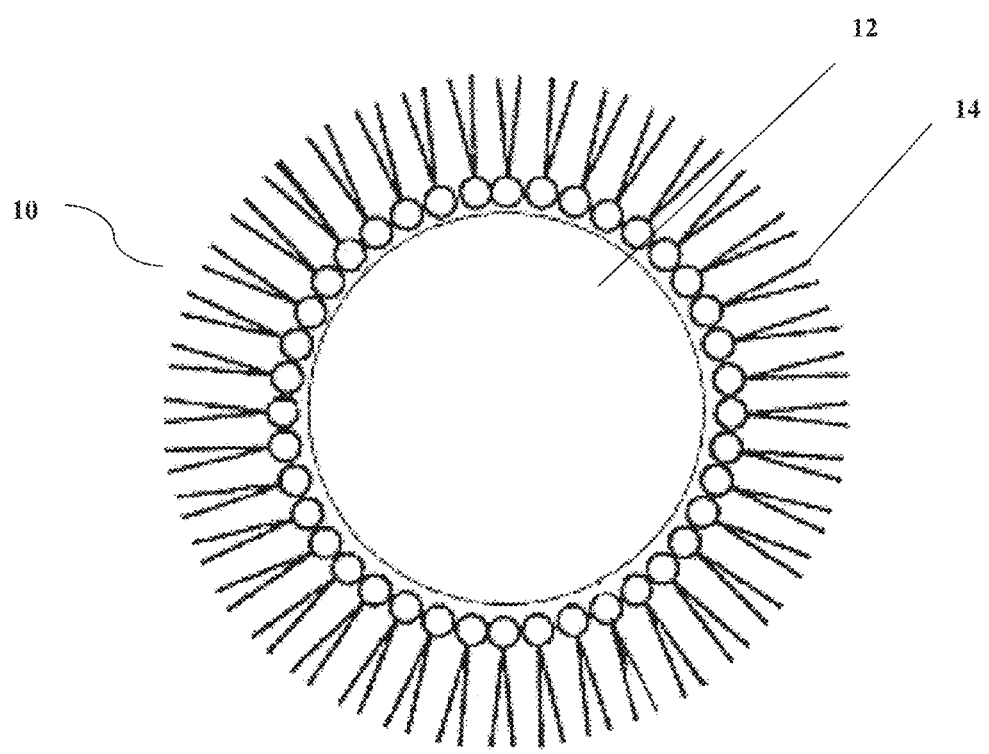
FIGS. 1 and 2 show presumed structures of copper nanoparticles suitable for use in forming the photovoltaic cells described herein.

The present disclosure is directed, in part, to photovoltaic cells having current collectors formed from metal nanoparticles, particularly copper nanoparticles. The present disclosure is also directed, in part, to methods for making photovoltaic cells from metal nanoparticles, particularly copper nanoparticles.

Nanoparticles can exhibit a number of physical and chemical properties that differ significantly from those of the corresponding bulk substance. One property of nanoparticles that can be of particular importance is nanoparticle fusion that occurs at or above the nanoparticles' fusion temperature. As used herein, the term "fusion temperature" will refer to the temperature at which a nanoparticle liquefies, thereby giving the appearance of melting. As used herein, the terms "fused" and "fusion" will refer to the coalescence or partial coalescence of nanoparticles with one another. The drop in apparent melting point can be a particularly significant feature for metal nanoparticles. Upon decreasing in size, particularly below about 20 nm in equivalent spherical diameter, the temperature at which metal nanoparticles can be liquefied drops dramatically from that of the corresponding bulk metal. For example, copper nanoparticles having a size of about 20 nm or less can have fusion temperatures of about 220° C. or below, in comparison to bulk copper's melting point of 1083° C.

The low fusion temperature of copper nanoparticles places them in a temperature regime in which they can be processed at significantly lower temperatures than the silver pastes currently used in the manufacturing of photovoltaic cells. The ability to process copper nanoparticles at significantly reduced temperatures relative to silver represents a distinct process advantage compared to current approaches for manufacturing photovoltaic cells. Moreover, since copper nanoparticles can become at least partially fused together with one another to form a bulk lattice of polycrystalline copper at or above the fusion temperature, higher electrical conductivities can be realized than with only grain-to-grain contact being present, as in silver pastes. As an additional advantage, the reduced processing temperatures of copper nanoparticles offer the opportunity to utilize lower quality and lower cost substrates that are not particularly thermally resistant during manufacturing processes.

Despite the potential advantages that copper nanoparticles can provide in the fabrication of photovoltaic cells, copper does not represent a simple "drop-in" replacement for silver in their manufacture, as copper presents significant challenges that are not encountered with silver. Foremost, copper atoms diffuse into silicon along grain boundaries much faster than do silver atoms. If excessive metal diffusion into the semiconductor occurs, particularly into the n-doped region of a p-type semiconductor (i.e., into the p-n junction), performance of the photovoltaic cell can become diminished due to the occurrence of trapped states. Although silver also somewhat presents a diffusion problem in this regard, it can be readily addressed through the in situ formation of a diffusion barrier when glass frit is used to etch through a SiN antireflective coating on the surface of silicon-based semiconductors during manufacturing of photovoltaic cells, where the glass frit serves as the diffusion barrier. Due to copper's much higher effective diffusion rate, such diffusion barriers can be ineffective for this metal, since excessive copper can pass into the semiconductor while etching is taking place. Furthermore, over the decade or more working lifetime of photovoltaic cells, such diffusion barriers can be insufficient to limit the slow diffusion of copper into the semiconductor. Implementation of effective, long-lived diffusion barriers for copper in photovoltaic cells is described hereinbelow.

Another issue that can be encountered with copper nanoparticles is that of developing a suitable formulation that can be deposited with precision on a semiconductor substrate in order to maintain high cell efficiencies. As-produced copper nanoparticles are often prone to clumping and are difficult to use directly, particularly in precision applications such as screen and ink-jet printing techniques, for example. In the manufacture of conventional photovoltaic cells, screen and ink-jet printing techniques are commonly used due to their high throughput capabilities, instead of the more precise but lower throughput and more costly lithographic techniques, despite the latter's ability to produce photovoltaic cells having higher efficiencies. For example, photovoltaic cells that are fabricated by lithography techniques can have a 1-1.5%-fold increase in cell efficiency relative to photovoltaic cells that are fabricated by printing techniques. Nanoparticle paste formulations that can be utilized in precision deposition techniques and their implementation in the fabrication of photovoltaic cells are also described herein. Such nanoparticle paste formulations can achieve printed line widths as low as about 5-10 microns, in contrast to printed line widths of about 100-150 microns in conventional photovoltaic cells that are fabricated from silver paste. The printed line widths attainable with copper nanoparticle paste formulations can be comparable with those attainable by lithography techniques. Thus, using copper nanoparticles in a dispensable nanoparticle paste formulation can allow cell efficiencies to be improved without the throughput issues associated with lithography techniques. In this regard, copper nanoparticle paste formulations can permit high aspect ratio copper-based current collectors to be fabricated, thereby minimizing shadowing effects on the photovoltaic cells.

Copper nanoparticles also can provide additional advantages in the fabrication of photovoltaic cells that are often not attainable in conventional photovoltaic cells manufactured from silver pastes. First, by using copper nanoparticles, photovoltaic cells can be readily fabricated in which there are no electrical contacts on a face of the photovoltaic cells that receives electromagnetic radiation. That is, the copper-based current collector can be located on a face of the photovoltaic cell opposite a face of the photovoltaic cell that receives electromagnetic radiation. Disposition of the copper-based current collector in this manner can increase the effective surface area of the photovoltaic cell that is available for receipt of electromagnetic radiation, thereby increasing cell efficiency. Of course, in other embodiments, the copper-based current collector can also be located on a face of the photovoltaic cell that receives electromagnetic radiation. Each of these configurations is described in more detail herein.

Even more advantageously, when the photovoltaic cell contains a copper-based current collector located on a face of the photovoltaic cell opposite the face of the photovoltaic cell that receives or is configured to receive electromagnetic radiation, the copper nanoparticles can perform multiple roles in addition to forming the copper contact of the copper-based current collector. First, as the copper nanoparticles become at least partially fused together with one another, they can simultaneously adhere the semiconductor substrate to another surface, thereby sandwiching the copper contact between the semiconductor substrate and the other surface and leaving the photovoltaic cell configured to receive electromagnetic radiation on its open face. In the fabrication of conventional photovoltaic cells, a separate bonding operation is usually necessary. Second, the copper contact can provide an excellent heat transfer pathway to the other surface. Use of fused copper nanoparticles for heat management and transfer is described in commonly owned U.S. patent application Ser. No. 13/079,757, filed Apr. 4, 2011, which is incorporated herein by reference in its entirety. If the other surface is thermally stable, it can serve as a heat sink to dissipate heat generated in the photovoltaic cell during its operation. The ability to form a heat transfer pathway at the low processing temperatures of copper nanoparticles represents a distinct advantage over the high temperature processes used in the fabrication of conventional photovoltaic cells. A final advantage of locating the copper contact in the above manner is that it introduces roughness to the "back-side" of the photovoltaic cell and reduces reflectance of electromagnetic radiation therefrom, again increasing the cell efficiency.

As used herein, the terms "partially fused," "partial fusion," and other derivatives and grammatical equivalents thereof will refer to the partial coalescence of nanoparticles with one another. For example, whereas totally fused metal nanoparticles retain essentially none of the structural morphology of the original unfused metal nanoparticles (i.e., they resemble bulk polycrystalline or multi-crystalline metal, or a lattice thereof), partially fused metal nanoparticles retain at least some of the structural morphology of the original unfused metal nanoparticles. The properties of partially fused metal nanoparticles can be intermediate between those of the corresponding bulk metal and the original unfused metal nanoparticles.

As used herein, the term "nanoparticles" will refer to particles that are about 100 nm or less in size, without particular reference to the shape of the particles. As used herein, the term "copper nanoparticles" will refer to copper particles that are about 100 nm or less in size, without particular reference to the shape of the copper particles.

As used herein, the term "organic matrix" will refer to a continuous fluid phase containing one or more organic compounds.

As used herein, the term "micron-scale metal particles" will refer to metal particles that are about 100 nm or greater in size in at least one dimension. As used herein, the term "micron-scale copper particles" will refer to copper particles that are about 100 nm or greater in size in at least one dimension.

In various embodiments, photovoltaic cells described herein can include a copper-based current collector located on a semiconductor substrate having an n-doped region and a p-doped region. The semiconductor substrate is configured for receipt of electromagnetic radiation and generation of an electrical current therefrom. The copper-based current collector includes an electrically conductive diffusion barrier disposed on the semiconductor substrate and a copper contact disposed on the electrically conductive diffusion barrier. The copper contact is formed from copper nanoparticles that have been at least partially fused together. The electrically conductive diffusion barrier limits the passage of copper therethrough.

In various embodiments, methods for forming photovoltaic cells from copper nanoparticles can include applying an electrically conductive diffusion barrier onto a semiconductor substrate having an n-doped region and a p-doped region, applying copper nanoparticles onto the electrically conductive diffusion barrier, and heating the copper nanoparticles to a temperature sufficient to at least partially fuse the copper nanoparticles together, thereby forming a copper contact on the electrically conductive diffusion barrier. The electrically conductive diffusion barrier limits the passage of copper therethrough.

Although some embodiments of photovoltaic cells are described herein with reference to copper nanoparticles, it is to be recognized that other types of metal nanoparticles can be used as well. Suitable alternative metals can include, but are not limited to, aluminum or nickel, for example. In addition, in some embodiments, mixtures of different types of metal nanoparticles can be used when fabricating the photovoltaic cells described herein. For example, in some embodiments, a mixture of copper nanoparticles and nickel nanoparticles can be used to fabricate the photovoltaic cells. Mixtures of metal nanoparticles can create alloys once nanoparticle fusion takes place, and the alloys can display increased corrosion resistance compared to copper alone. Suitable alloys having corrosion resistance can be envisioned by one having ordinary skill in the art. Likewise, admixture of copper nanoparticles with micron-scale particles of other metals can also produce metal alloys having increased corrosion resistance.

In some embodiments, at least a portion of the copper nanoparticles used in forming the photovoltaic cells can be about 20 nm or smaller in size. As discussed above, copper nanoparticles in this size range can have fusion temperatures that are significantly lower than that of bulk copper and readily undergo fusion with one another as a result. For example, copper nanoparticles that are about 20 nm or smaller in size can have fusion temperatures of about 220° C. or below (e.g., a fusion temperature in the range of about 150° C. to about 220° C.) or about 200° C. or below. In some embodiments, at least a portion of the copper nanoparticles can be about 10 nm or less in size, or about 5 nm or less in size. In some embodiments, at least a portion of the copper nanoparticles can range between about 1 nm in size to about 20 nm in size, or between about 1 nm in size and about 10 nm in size, or between about 1 nm in size to about 5 nm in size, or between about 3 nm in size to about 7 nm in size, or between about 5 nm in size to about 20 nm in size. In some embodiments, larger copper nanoparticles can be combined with copper nanoparticles that are about 20 nm in size or smaller. For example, in some embodiments, copper nanoparticles ranging from about 1 nm in size to about 10 nm in size can be combined with copper nanoparticles that range from about 25 nm in size to about 50 nm in size, or from about 25 nm in size to about 100 nm in size. As further discussed below, micron-scale copper particles or other types of particles can also be combined with the copper nanoparticles in some embodiments. Although larger copper nanoparticles and micron-scale copper particles may not be liquefiable at low temperatures, they can still become fused with one another upon liquefying copper nanoparticles at or above their fusion temperature, as generally discussed above.

In some embodiments, the copper nanoparticles can have a surfactant coating thereon, where the surfactant coating contains one or more surfactants. The surfactant coating can be formed on the copper nanoparticles during their synthesis. Formation of a surfactant coating on the copper nanoparticles during their synthesis can desirably limit the ability of the copper nanoparticles to fuse to one another, limit agglomeration of the copper nanoparticles, and promote the formation of a population of copper nanoparticles having a narrow size distribution. Further details regarding the synthesis of copper nanoparticles and suitable surfactants are discussed in more detail below.

Any suitable technique can be employed for forming the copper nanoparticles used in the embodiments described herein. Particularly facile metal nanoparticle fabrication techniques are described in commonly owned U.S. Pat. Nos. 7,736,414, 8,105,414, and 8,192,866 and commonly owned U.S. patent application Ser. No. 13/656,590, filed Oct. 19, 2012; Ser. No. 13/228,411, filed Sep. 8, 2011; Ser. No. 13/040,207, filed Mar. 3, 2011; and Ser. No. 12/813,463, filed Jun. 10, 2010, each of which is incorporated herein by reference in its entirety. As described therein, metal nanoparticles can be fabricated in a narrow size range by reduction of a metal salt in a solvent in the presence of a suitable surfactant system, which can include one or more different surfactants. Further description of suitable surfactant systems follows below. Without being bound by any theory or mechanism, it is believed that the surfactant system can mediate the nucleation and growth of the metal nanoparticles, limit surface oxidation of the metal nanoparticles, and/or inhibit metal nanoparticles from extensively aggregating with one another prior to being at least partially fused together. Suitable organic solvents for solubilizing metal salts and forming metal nanoparticles can include, for example, formamide, N,N-dimethylformamide, dimethyl sulfoxide, dimethylpropylene urea, hexamethylphosphoramide, tetrahydrofuran, and glyme, diglyme, triglyme, and tetraglyme. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or tetraalkylammonium borohydrides).

Figure 2:
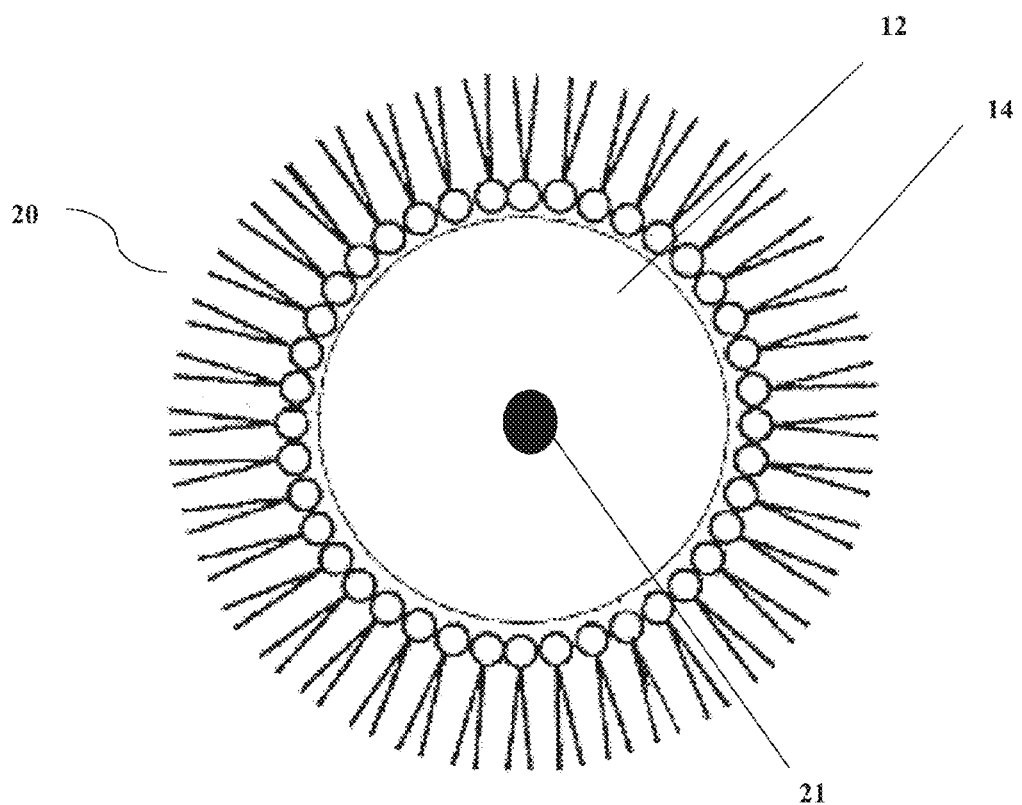

FIGS. 1 and 2 show presumed structures of copper nanoparticles suitable for use in forming the photovoltaic cells described herein. As shown in FIG. 1, copper nanoparticle 10 includes copper core 12 and surfactant layer 14 overcoating copper core 12. Surfactant layer 14 can contain any combination of surfactants, as described in more detail below. Copper nanoparticle 20 shown in FIG. 2 is similar to that depicted in FIG. 1, but copper core 12 is grown about nucleus 21, which can be a metal that is the same as or different than that of the copper of copper core 12. Because nucleus 21 is buried deep within copper core 12 in copper nanoparticle 20, it is not believed to significantly affect the overall nanoparticle properties. In some embodiments, the copper nanoparticles can have an amorphous morphology.

In various embodiments, the surfactant system used to prepare the copper nanoparticles can include one or more surfactants. The differing properties of various surfactants can be used to tailor the properties of the copper nanoparticles. Factors that can be taken into account when selecting a surfactant or combination of surfactants for use in synthesizing copper nanoparticles can include, for example, ease of surfactant dissipation from the copper nanoparticles during nanoparticle fusion, nucleation and growth rates of the copper nanoparticles, and the like.

In some embodiments, an amine surfactant or combination of amine surfactants, particularly aliphatic amines, can be used during the synthesis of copper nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure versus having ready volatility and/or ease of handling. For example, primary allylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-hexylamine, n-heptylamine, n-octylamine, n-nonylamine, or n-decylamine, for example. While these are all straight chain primary alkylamines, branched chain primary alkylamines can also be used in other embodiments. For example, branched chain primary alkylamines such as, for example, 7-methyloctylamine, 2-methyloctylamine, or 7-methylnonylamine can be used. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the copper coordination sphere but be readily dissociable therefrom during copper nanoparticle fusion.

In some embodiments, the surfactant system can include a secondary amine. Secondary amines suitable for forming copper nanoparticles can include normal, branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic. Without being bound by theory or mechanism, it is believed that diamine chelating agents can facilitate copper nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for use in forming metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenediamines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N,N,N',N'-tetraethylethylenediamine, and the like.

Surfactants other than aliphatic amines can also be present in the surfactant system. In this regard, suitable surfactants can include, for example, pyridines, aromatic amines, phosphines, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$, where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N,N-diethylaniline, and the like. Other aromatic amines that can be used in conjunction with forming copper nanoparticles can be envisioned by one having ordinary skill in the art.

Suitable pyridines can include both pyridine and its derivatives. Illustrative pyridines that can be suitable for use in forming copper nanoparticles include, for example, pyridine, 2-methylpyridine, 2,6-dimethylpyridine, collidine, pyridazine, and the like. Chelating pyridines such as bipyridyl chelating agents can also be used. Other pyridines that can be used in conjunction with forming copper nanoparticles can be envisioned by one having ordinary skill in the art.

Suitable phosphines can have a formula of $PR_3$, where R is an alkyl or aryl group containing from 1 to about 16 carbon atoms. The alkyl or aryl groups attached to the phosphorus center can be the same or different. Illustrative phosphines that can be used in forming copper nanoparticles include, for example, trimethylphosphine, triethylphosphine, tributylphophine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used. Illustrative chelating phosphines can include 1,2-bisphosphines, 1,3-bisphosphines, and bis-phosphines such as BINAP, for example. Other phosphines that can be used in conjunction with forming copper nanoparticles can be envisioned by one having ordinary skill in the art.

Suitable thiols can have a formula of RSH, where R is an alkyl or aryl group having from about 4 to about 16 carbon atoms. Illustrative thiols that can be used for forming copper nanoparticles include, for example, butanethiol, 2-methyl-2-propanethiol, hexanethiol, octanethiol, benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with forming copper nanoparticles can be envisioned by one having ordinary skill in the art.

In general, the disposition of the n-doped region and the p-doped region relative to one another within the semiconductor substrate is not believed to be particularly limited. In some embodiments, the n-doped region and the p-doped region can be vertically disposed relative to one another. In other embodiments, the n-doped region and the p-doped region can be horizontally disposed relative to one another. In some embodiments, the n-doped region, the p-doped region, or both can be located on a face of the photovoltaic cell that receives or is configured to receive electromagnetic radiation. In other embodiments, the n-doped region, the p-doped region, or both can be located on a face of the photovoltaic cell that is opposite a face of the photovoltaic cell that receives or is configured to receive electromagnetic radiation. In some embodiments, the copper-based current collector can be in contact with the n-doped region of the semiconductor substrate. In further embodiments, the photovoltaic cells described herein can also include an electrical connection in contact with the p-doped region of the semiconductor substrate.

In some embodiments, when the n- and p-doped regions of the semiconductor substrate are vertically disposed relative to one another, the copper-based current collector can form a front-side electrical contact and the electrical connection in contact with the p-doped region can form a back-side electrical contact. As used herein, the term "front-side electrical contact" will refer to an electrical contact on the same face of the photovoltaic cell upon which electromagnetic radiation is incident, and the term "back-side electrical contact" will refer to an electrical contact on the opposite face of the photovoltaic cell relative to the face upon which electromagnetic radiation is incident. In some embodiments, a back-side electrical contact can cover a significant portion or all of the back face of the semiconductor substrate, since there is no need to collect incident electromagnetic radiation thereon. In contrast, a front-side electrical contact is desirably made to have a footprint that is as small as possible, with small line widths, in order to maximize the amount of incident electromagnetic radiation received by the semiconductor substrate, while still maintaining enough surface area to achieve a desired degree of electrical conduction. That is, front-side electrical contacts desirably have a high aspect ratio that maximizes surface area of the electrical contact while limiting the area in contact with the semiconductor substrate.

In embodiments where the n- and p-doped regions of the semiconductor substrate are horizontally disposed relative to one another, the electrical contacts can be located on both the front-side and the back-side of the semiconductor substrate, or they can all be located on the backside of the semiconductor substrate. Each configuration is described in more detail below.

In some embodiments, the semiconductor substrate can be a silicon substrate, which can include any of single crystal silicon, polycrystalline silicon, amorphous silicon, or any combination thereof. For example, in some embodiments, the semiconductor substrate can be a silicon substrate having a region of n-doped silicon and a region of p-doped silicon. Suitable dopants and techniques for n- and p-doping of silicon will be familiar to one having ordinary skill in the art. In other embodiments, suitable semiconductor substrates can include, for example, CdTe, CuInGaSc (CIGS), GaAs, quantum solar dots (e.g., CdS, CdSe, $Sb_2S_3$, PbS, and the like), Grätzel cell type solar cells, dye sensitized type solar cells (DSSC or DSC), and organophotovoltaic materials. Suitable organic photovoltaic materials will be familiar to one having ordinary skill in the art, and can include polymers such as poly(phenylenevinylene), poly(3-hexylthiophene), and like substances. It is to be noted that the electrically conductive diffusion barrier may optionally be omitted with some of these semiconductor substrates due to a reduced diffusion rate of copper atoms therein (e.g., organophotovoltaic materials)

Unlike the in situ-formed diffusion barriers for silver in conventional photovoltaic cells, the diffusion barriers for copper in the photovoltaic cells described herein are desirably electrically conductive by themselves and facilitate the adhesion of metal nanoparticles to the semiconductor substrate. Moreover, suitable diffusion barriers are intended to shield the semiconductor substrate from copper for an extended period of time (e.g., at least about 10-20 years). For deposition and fusion of metal nanoparticles on a silicon substrate, suitable electrically conductive diffusion barriers for copper can include thin films of refractory substances such as, for example, electrically conductive metal nitrides, electrically conductive metal carbides, electrically conductive metal borides, or any combination thereof. In some or other embodiments, suitable electrically conductive diffusion barriers for copper can include metal tungstides, metals, or any combination thereof. In some embodiments, the electrically conductive diffusion barrier can be a metal nitride. In more particular embodiments, the electrically conductive diffusion barrier can include substances such as, for example, TiN, TaN, WN, TiW, W, or any combination thereof.

In general, any suitable technique can be used to deposit the electrically conductive diffusion barrier. In some embodiments, chemical vapor deposition or physical vapor deposition can be used. Suitable chemical vapor deposition techniques can include, for example, thermochemical vapor deposition of a metal-organic precursor or plasma enhanced chemical vapor deposition. Suitable physical vapor deposition techniques can include atomic layer deposition and sputtering (e.g., magnetron sputtering), for example. Use of such vapor deposition techniques for forming thin films of refractory substances will be familiar to one having ordinary skill in the art. In still other embodiments, plating, evaporation, spin coating or lithographic deposition techniques can also be used to deposit the electrically conductive diffusion barrier.

In some embodiments, the electrically conductive diffusion barrier can be deposited on the semiconductor substrate while in nanoparticle form, with nanoparticle fusion taking place thereafter. More specifically, in some embodiments, methods described herein can further include applying a plurality of nanoparticles to a semiconductor substrate, and at least partially fusing the nanoparticles together to form the electrically conductive diffusion barrier. Fusion of the nanoparticles forming the diffusion barrier can take place in a manner similar to that described above for fusing the copper nanoparticles together. Suitable techniques for forming refractory nanoparticles are described in commonly owned U.S. patent application Ser. No. 12/191,975, filed Aug. 14, 2008, which is incorporated herein by reference in its entirety. More particularly, in some embodiments, the diffusion barrier of the photovoltaic cells described herein can be formed from nanoparticles of TiN, TaN, WN, TiW, W, or any combination thereof. After formation of the electrically conductive diffusion barrier from nanoparticles, copper nanoparticles can then be deposited thereon, and construction of the photovoltaic cell can be completed as generally described herein. In some embodiments, micron-size particles can also be present in combination with the nanoparticles being used to form the diffusion barrier.

In some embodiments, nanoparticles being used to form the diffusion barrier can optionally be combined with an aggressive or non-aggressive glass frit. For example, glass frit combined with the nanoparticles can be used to etch through a SiN antireflective coating on the semiconductor substrate, in much the same manner as a glass frit etch is conducted when annealing photovoltaic cells formed from silver pastes, as discussed above. However, when forming a diffusion barrier from nanoparticles containing glass frit, copper nanoparticles are subsequently deposited as described above, in order to make a copper contact configured for removal of current from the photovoltaic cells.

In some embodiments, the photovoltaic cells described herein can further include an antireflective coating disposed on a face of the semiconductor substrate that receives or is configured to receive electromagnetic radiation. In some embodiments, the antireflective coating can be disposed on the same face of the semiconductor substrate as the copper-based current collector. Specifically, in some embodiments, the antireflective coating can be disposed on the front-side of the semiconductor substrate in order to increase the amount of electromagnetic radiation that optically interacts with the semiconductor substrate. In some embodiments, the antireflective coating can be a SiN coating, particularly when the semiconductor substrate is a silicon substrate. Other types of suitable antireflective coatings will be familiar to one having ordinary skill in the art and can be substituted for a SiN antireflective coating in other embodiments of the present disclosure.

In addition to copper nanoparticles, other substances can be present when forming the copper contact or present in or on the copper contact after it is formed. In some embodiments, the copper contact can further include a corrosion-resistant substance. In some embodiments, the corrosion-resistant substance can be metal nanoparticles that are admixed with the copper nanoparticles and confer corrosion-resistance thereto. For example, in some embodiments discussed above, nickel (e.g., nickel nanoparticles) can be included with the copper nanoparticles to improve corrosion resistance. Other suitable substances for improving corrosion resistance can include substances having elements such as, for example, Zn, Si, Al, P, B, Ni, Sn, Ag, or SnAgCu, any of which can be in nanoparticle form. When mixed with copper nanoparticles, the corrosion-resistant substance can be present in an amount ranging between about 0.1 to about 5% by weight of the copper nanoparticles. In some or other embodiments, the copper contact can be coated with a corrosion-resistant substance. In addition to the corrosion-resistant substances noted above, a polymer coating can also be applied as a final coating to the photovoltaic cells to confer corrosion resistance thereto.

In some or other embodiments, the copper nanoparticles can be mixed with micron-scale copper particles or other micron-scale metal particles while being formed into the copper contact. In various embodiments, an amount of the micron-scale copper particles can range between about 0.1% to about 15% relative to the weight of the copper nanoparticles. In various embodiments, the micron-scale copper particles can range in size from about 500 nm to about 100 microns in at least one dimension.

In some or other embodiments, the copper contact can further include a conductive additive associated therewith. In some embodiments, the conductive additive can be mixed with the copper nanoparticles while they are being formed into the copper contact. In some or other embodiments, the conductive additive can be disposed on the copper contact after its formation. In some embodiments, the conductive additive can include substances such as carbon black, pyrene, phenanthrene, carbon nanowires, carbon nanotubes, graphene, any combination thereof, or any derivative thereof.

In some embodiments, copper nanoparticles can be applied to semiconductor substrates described herein when the copper nanoparticles are dispersed in a dispensable nanoparticle paste formulation. Any of the additional components described above can also be present in the nanoparticle paste formulations including, for example, micron-scale copper particles or other micron-scale metal particles, conductive additives, corrosion-resistant substances, or any combination thereof. In addition to the foregoing additives, various thickening and rheology control agents can also be present in order to impart a desired viscosity to the nanoparticle paste formulations. In general, suitable nanoparticle paste formulations can contain the copper nanoparticles dispersed in an organic matrix and be dispensable through micron-size apertures, thereby enabling deposition of the copper nanoparticles by techniques such as screen printing, stencil printing, or ink-jet printing, for example. Other suitable deposition techniques can include, for example, spray coating and spin coating of the dispensable nanoparticle paste formulations.

In some embodiments, the nanoparticle paste formulations can be formulated as described in commonly owned U.S. patent application Ser. No. 13/764,669 entitled "Nanoparticle Paste Formulations and Methods for Production and Use Thereof," filed on Feb. 11, 2013 and incorporated herein by reference in its entirety. Desirably, by including a high level of solids and carefully tailoring the organic matrix, the nanoparticle paste formulations can be readily dispensed and promote copper nanoparticle fusion while minimizing the occurrence of significant crack and void formation. As-produced copper nanoparticles, in contrast, can crack and form voids during nanoparticle fusion due to volume contraction resulting from surfactant and/or solvent loss. The nanoparticle paste formulations are described in brief hereinafter.

In some embodiments, the nanoparticle paste formulations can contain at least about 30% copper nanoparticles by weight, particularly about 30% to about 90% copper nanoparticles by weight of the nanoparticle paste formulation, or about 50% to about 90% copper nanoparticles by weight of the nanoparticle paste formulation, or about 70% to about 90% copper nanoparticles by weight of the nanoparticle paste formulation. Moreover, in some embodiments, in addition to copper nanoparticles, micron-scale copper particles can be present in the nanoparticle paste formulations in an amount ranging between about 0.01% to about 15% by weight of the nanoparticle paste formulation. In some embodiments, the micron-size copper particles can range between about 100 nm and about 5 microns in size, or between about 500 nm and about 5 microns in size, or between about 500 nm and about 100 microns in size in at least one dimension. Although such micron-scale copper particles need not necessarily be present, they have been found to desirably promote the fusion of copper nanoparticles to one another to form a consolidated mass.

In some embodiments, the nanoparticle paste formulations can contain an organic matrix that includes one or more organic solvents. Without being bound by any theory or mechanism, it is believed that the organic solvents can promote solubilization of the surfactants forming the surfactant coating, such that they are no longer associated with the copper nanoparticles and thereby promote nanoparticle fusion. The one or more organic solvents can include any combination of hydrocarbons, alcohols, amines, and organic acids. Remaining unbound by any theory or mechanism, it is believed that hydrocarbon and alcohol solvents can passively solubilize surfactant molecules liberated from the copper nanoparticles by Brownian motion, whereas amine and organic acid solvents can actively chemically interact with the surfactant molecules such that they are no longer available for recombination with the copper nanoparticles.

In some embodiments, the nanoparticle paste formulations can include the combination of one or more hydrocarbons, one or more alcohols, one or more amines, and one or more acids. In some embodiments, between about 2 and about 10 members of each class of organic solvents can be present. The number of members of each class of organic solvent can be the same or different. In some embodiments, the members of each class can have boiling points that are separated from one another by a desired degree, so as to reduce the suddenness of solvent loss while fusing the nanoparticles together with one another and decreasing the rate of volume contraction during nanoparticle fusion. More specifically, in some embodiments, the various members of each class can have boiling points that are separated from one another by about 20° C. to about 50° C. Furthermore, in some embodiments, the various organic solvents in the organic matrix can have boiling points ranging between about 50° C. and about 200° C. or between about 50° C. and about 250° C.

Illustrative but non-limiting examples of alcohol and hydrocarbon solvents that can be present in the nanoparticle paste formulations include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-

$C_{13}$ alkanes), diisopropyleneglycol monomethyl ether, diethyleneglycol diethyl ether, 2-propanol, 2-butanol, t-butanol, 1-hexanol, 2-(2-butoxyethoxy)ethanol, terpineol, monohydric alcohols, diols, triols, glycol ethers (e.g., diethylene glycol and triethylene glycol), alkanolamines (e.g., ethanolamine, triethanolamine, and the like), or any combination thereof. In some embodiments, polyketone solvents can be used in a like manner.

Illustrative but non-limiting examples of amine solvents that can be present in the nanoparticle paste formulations include, for example, tallowamine (CAS 61790-33-8), alkyl ($C_8$-$C_{18}$) unsaturated amines (CAS 68037-94-5), di(hydrogenated tallow)amine (CAS 61789-79-5), dialkyl ($C_8$-$C_{20}$) amines (CAS 68526-63-6), alkyl ($C_{10}$-$C_{16}$)dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-1-7).

Illustrative but non-limiting examples of organic acid solvents that can be present in the nanoparticle paste formulations include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, α-linolenic acid, stearidonic acid, oleic acid, and linoleic acid.

Figure 3:
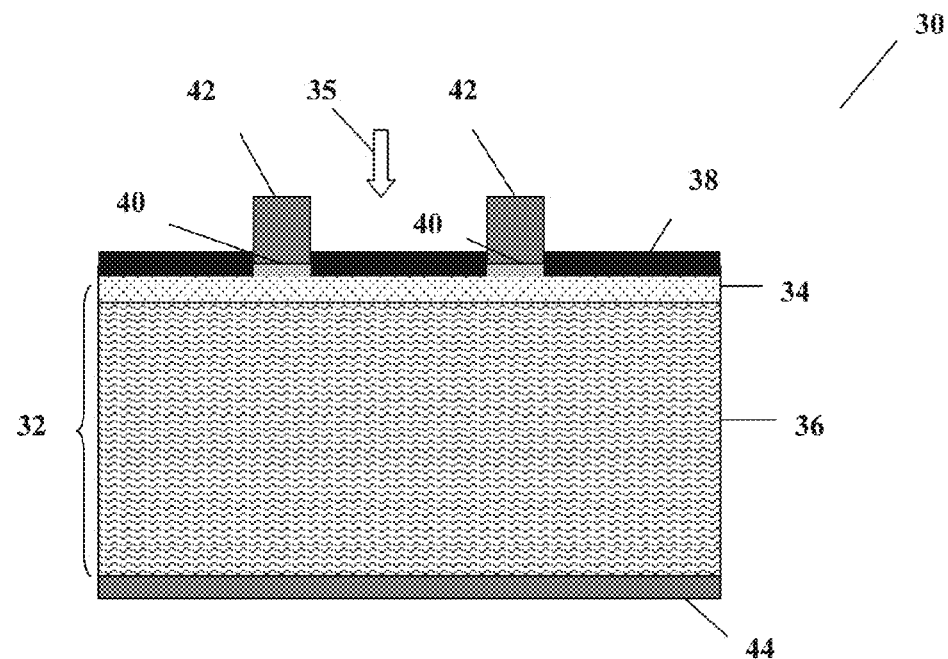
FIGS. 3 and 4 show schematics of illustrative photovoltaic cells having a front-side copper-based current collector disposed thereon.
Figure 4:
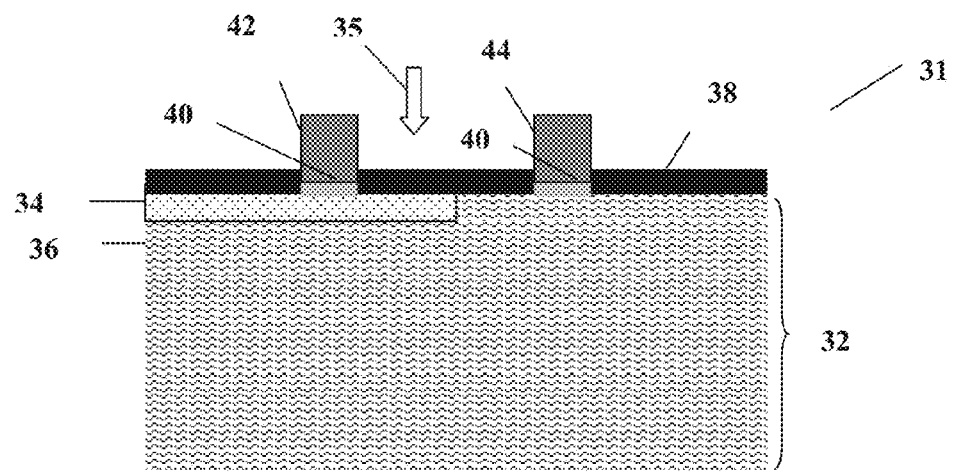

In accordance with some embodiments described above, FIGS. 3 and 4 show schematics of illustrative photovoltaic cells having a front-side copper-based current collector disposed thereon. For convenience, photovoltaic cells 30 and 31 depicted in FIGS. 3 and 4, respectively, will be described with reference to a silicon semiconductor substrate. However, as described above, any suitable semiconductor can be used. As depicted in FIGS. 3 and 4, silicon semiconductor substrate 32 is typically p-doped and contains n-doped region 34 (i.e., n-doped silicon) and p-doped region 36 (i.e., p-doped silicon) therein. The silicon semiconductor substrate configurations depicted in FIGS. 3 and 4 can be fabricated starting from p-doped silicon and patterning n-doped region 34 though a suitable doping technique, such as ion-implantation of an n-dopant. In FIG. 3, n-doped region 34 and p-doped region 36 are vertically disposed relative to one another, and in FIG. 4, they are disposed side-by-side. Either configuration can be used in the embodiments described herein. Incident electromagnetic radiation 35 denotes the face of the photovoltaic cells upon which the electromagnetic radiation is incident.

With continued reference to FIGS. 3 and 4, antireflective coating 38 is disposed on the front-side of silicon semiconductor substrate 32, upon which electromagnetic radiation 35 is incident. Portions of antireflective coating 38 are patterned and/or removed to provide electrical exposure to silicon semiconductor substrate 32. Thereafter, electrically conductive diffusion barrier 40 is directly disposed on n-doped region 34, and copper contact 42 is formed thereon. As described above, copper contact 42 can be formed from at least partial fusion of copper nanoparticles. In FIG. 3, electrical connection 44 is formed as a back-side electrical connection in electrical communication with p-doped region 36. As depicted, electrical connection 44 spans the entirety of p-doped region 36, but it need not necessarily do so. Contrastingly, in FIG. 4, electrical connection 44 is formed as a front-side electrical connection in electrical communication with p-doped region 36. In the embodiment depicted in FIG. 4, electrical connection 44 can be formed from copper nanoparticles that have been at least partially fused together on diffusion barrier 40.

Figure 5:
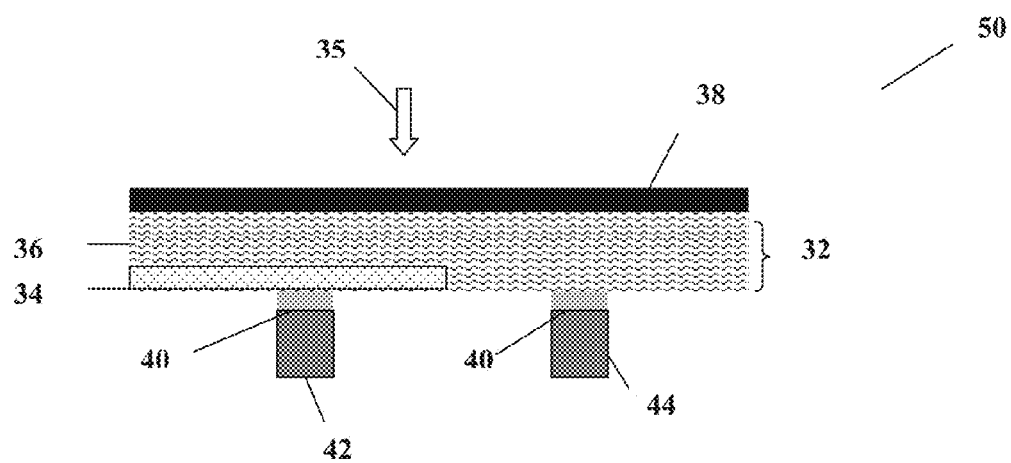
FIG. 5 shows a schematic of an illustrative photovoltaic cell having a back-side copper-based current collector disposed thereon.

As described above, the copper-based current collectors can also be configured as back-side electrical contacts. FIG. 5 shows a schematic of an illustrative photovoltaic cell having a back-side copper-based current collector disposed thereon. The side-by-side disposition of n-doped region 34 and p-doped region 36 in photovoltaic cell 50 is similar to that depicted in FIG. 4. In the case of a back-side electrical contact, a significant fraction of incident electromagnetic radiation 35 is absorbed near the top surface of silicon semiconductor substrate 32 before reaching the p-n junction. Accordingly, the overall thickness of silicon semiconductor substrate 32 is kept as small as possible in order to create a large fraction of charge carriers within the diffusion length of the p-n junction. As in FIG. 4, electrical connection 44 in electrical communication with p-doped region 36 can also be fabricated from copper nanoparticles. Optionally, a compliant material (not depicted) can be used to fill the voids between copper contact 42 and electrical connection 44. The compliant material can desirably reduce the amount of CTE mismatch that can be present when adhering photovoltaic cell 50 to another surface.

It bears mention that although the foregoing FIGURES have depicted only a single copper contact 42 or electrical connection 44 in electrical communication with n-doped region 34 and p-doped region 36, respectively, multiple copper contacts 42 and electrical connections 44 can be present, particularly if copper contact 42 and electrical connection 44 are on the same face of the photovoltaic cell. If multiple copper contacts 42 or electrical connections 44 are present, they can be connected in parallel to like elements via a busbar. The busbar can consolidate the flow of electrical current from the photovoltaic cell. Such techniques for connecting multiple electrical elements in parallel to one another will be familiar to one having ordinary skill in the art.

Various techniques can be used to form the copper-based current collector on the semiconductor substrate. Some of these illustrative techniques will be described in more detail below. However, it should be recognized that these techniques are merely illustrative in nature, and other protocols for forming copper-based current collectors on the photovoltaic cells described herein can be envisioned by one having ordinary skill in the art.

In some embodiments, the electrically conductive diffusion barrier can be deposited on the semiconductor substrate by plating, CVD, PVD or the like. Thereafter, a photoresist material can be applied, and the photoresist material can then be etched to remove undesired material. Deposition of copper nanoparticles can then follow. In other embodiments, a lift-off technique can be performed, where the photoresist is deposited first, followed by patterning, etching, diffusion barrier deposition, and copper nanoparticle deposition. The photoresist and material deposited thereon can be removed to re-expose the surface of the semiconductor substrate. Suitable deposition and patterning techniques will be familiar to one having ordinary skill in the art. Thereafter, an antireflective coating can be applied to the face of the semiconductor substrate that receives electromagnetic radiation, which can also convey additional oxidation protection to the current collectors. Similar techniques can be used to apply a copper-based current collector to the face of the semiconductor substrate that is opposite the face that receives electromagnetic radiation.

As a non-limiting example, the following describes an illustrative lift-off technique in which high aspect ratio copper contacts with minimized shadows effects can be fabricated. First, a thick layer (10-30 microns) of photoresist (e.g., SU8) can be deposited and patterned, followed by a thin layer of the electrically conductive diffusion barrier and then copper nanoparticles into the patterned areas. Here, the copper nanoparticles can be applied as if the photoresist is a stencil, with deposition taking place into the recessed areas. In such embodiments, the line widths of the copper contacts can be as small as between about 5-10 microns or as large as between about 100-300 microns. The line widths can be about 30 microns or greater in some embodiments, or between about 30-100 microns in other embodiments. Such line widths can greatly reduce shadowing effects, thereby promoting an overall rise in efficiency of the photovoltaic cells by increasing the degree of illumination thereon. In some embodiments, the copper nanoparticles can be spray coated or spin coated to fill the recesses in the photoresist. In other embodiments, the copper nanoparticles can be direct printed into the recesses using screen printing, micro-dispensing, ink-jet printing, or like deposition techniques.

In still other embodiments, a combination approach can be applied wherein the electrically conductive diffusion barrier is applied by a photolithography technique, and the copper nanoparticles are patterned using screen printing, micro-dispensing, ink-jet printing, or like techniques. In cases where photolithography techniques are used, improvements in throughput can be achieved during the photolithography step by creating a duplicated mask and exposing many semiconductor substrates in succession or at one time. Either inline or batch photolithography techniques can be applied in order to reduce costs.

To facilitate a better understanding of the embodiments described herein, the following experimental examples are provided. The examples are provided for purposes of illustration only and should be considered non-limiting.

EXAMPLES

Example 1

Testing of Diffusion Barriers for Copper on a Silicon Substrate

A 100 mm diameter CZ <100> silicon wafer was coated with a 50 nm thick layer of diffusion barrier as set forth in Table 1. A 50 nm layer of copper was then deposited on top of the diffusion barrier. Bulk copper was deposited by sputtering techniques. The sample indicated as nanoCu was deposited by a stencil deposition technique described below.

The nanoCu sample was deposited using Kapton tape as a rough stencil. Thereafter, a copper nanoparticle paste containing 3.5% micron-scale copper flakes and 15% organic matrix was applied to the rough stencil. The copper nanoparticles were then dried and fused for 20 minutes at 50° C., 20 minutes at 90° C., and 4 minutes at 210° C.

The samples were aged for 2 weeks at 353° C. in a vacuum oven in an accelerated aging test, which is equivalent to 25 years of use at 50° C. As shown in Table 1, the diffusion barriers in wafers 2 and 5 were visually determined to best mitigate the diffusion of copper into the silicon.

TABLE 1

| Wafer | Layer 1 | Layer 2 | Layer 3 | Post Aging Visual Inspection |
|---|---|---|---|---|
| 1 | Cu 50 nm | — | — | Baseline, barely a tinge of copper color apparent, mostly silver color |
| 2 | Ti 20 nm | TiN 30 nm | Cu 50 nm | Still copper colored, little change from before |
| 3 | Ti 50 nm | Cu 50 nm | — | Burnt copper color, has a deep blue edge |
| 4 | Ni 50 nm | Cu 50 nm | — | Copper color mostly gone, slightly more apparent than in no barrier |
| 5 | Ta 50 nm | Cu 50 nm | — | Still copper colored, little change from before |
| 6 | Ti 20 nm | TiN 30 nm | nanoCu (stencil deposition) | Not performed |

Figure 6A:
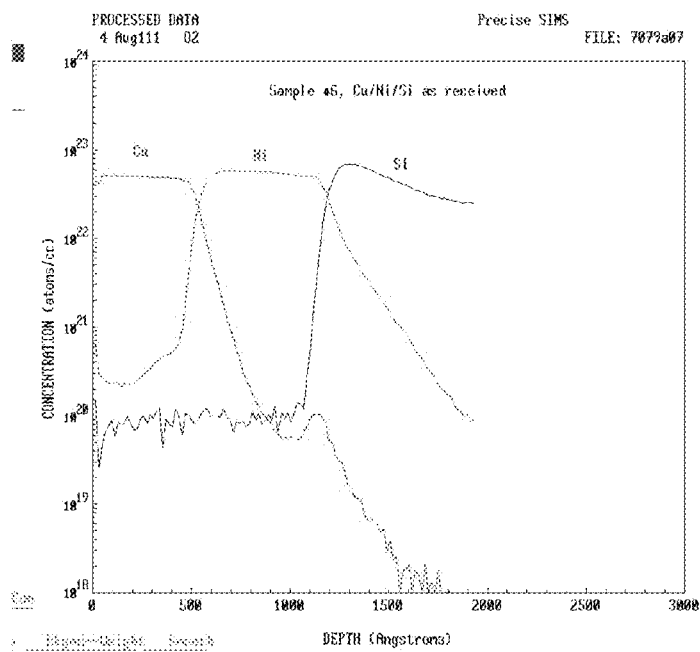
FIGS. 6A and 6B show precision secondary ion mass spectrometry for wafer 4, pre- and post-anneal, respectively.
Figure 6B:
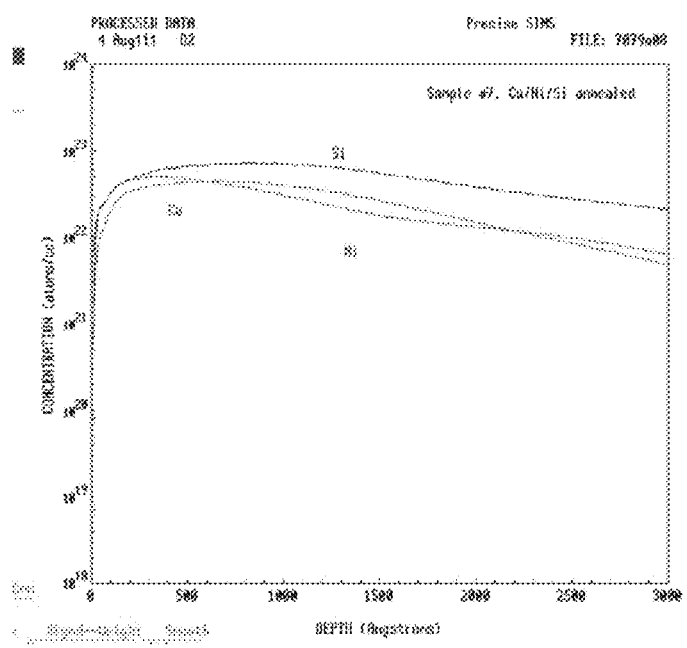
Figure 7A:
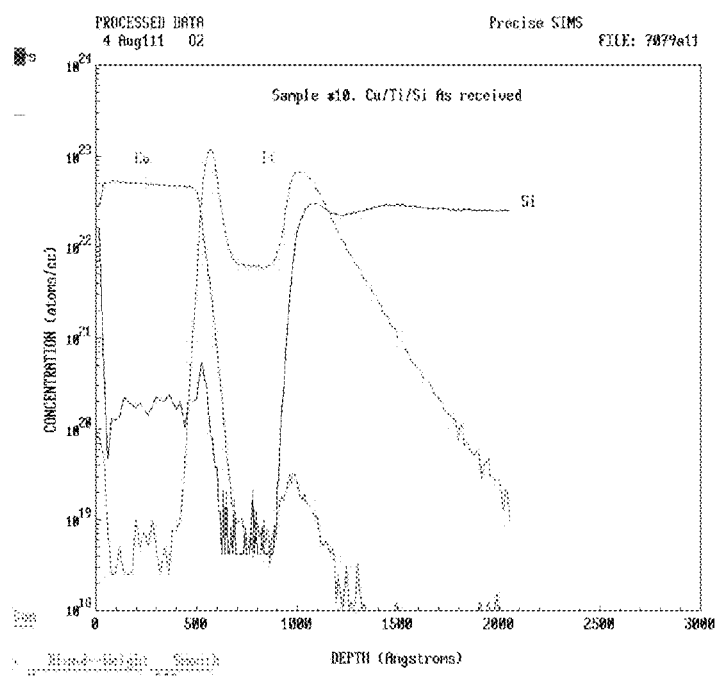
FIGS. 7A and 7B show precision secondary ion mass spectrometry for wafer 3, pre- and post-anneal, respectively.
Figure 7B:
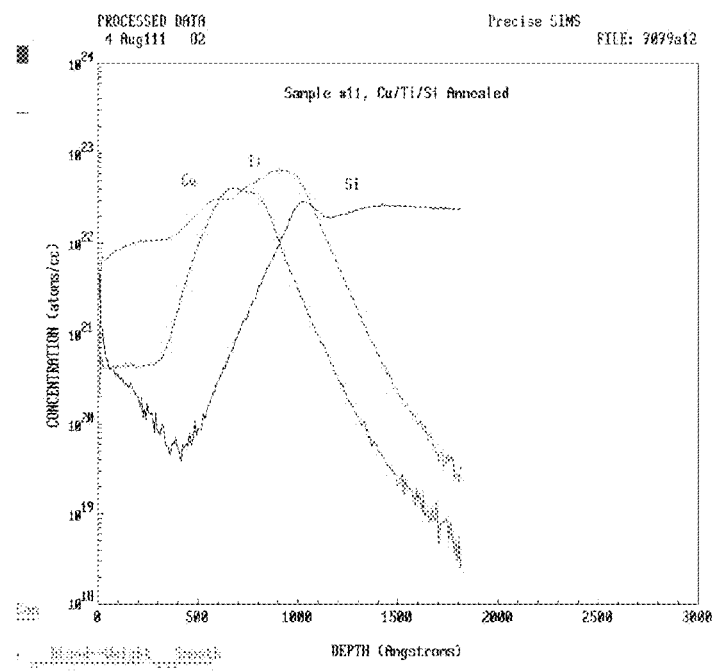
Figure 8A:
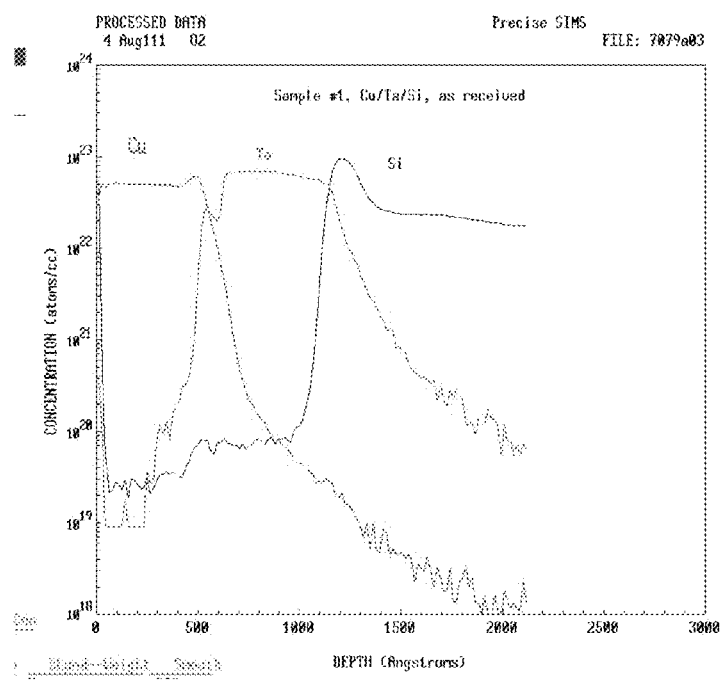
FIGS. 8A and 8B show precision secondary ion mass spectrometry for wafer 5, pre- and post-anneal, respectively.
Figure 8B:
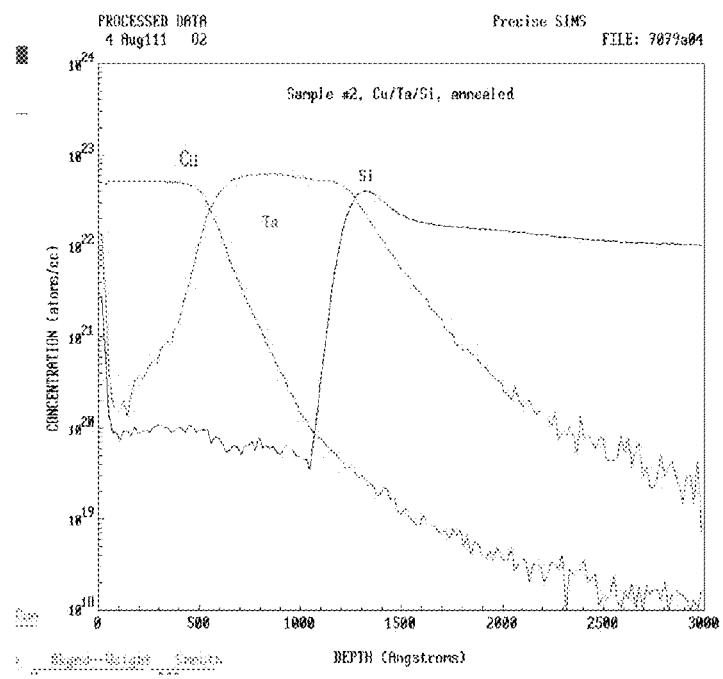
Figure 9A:
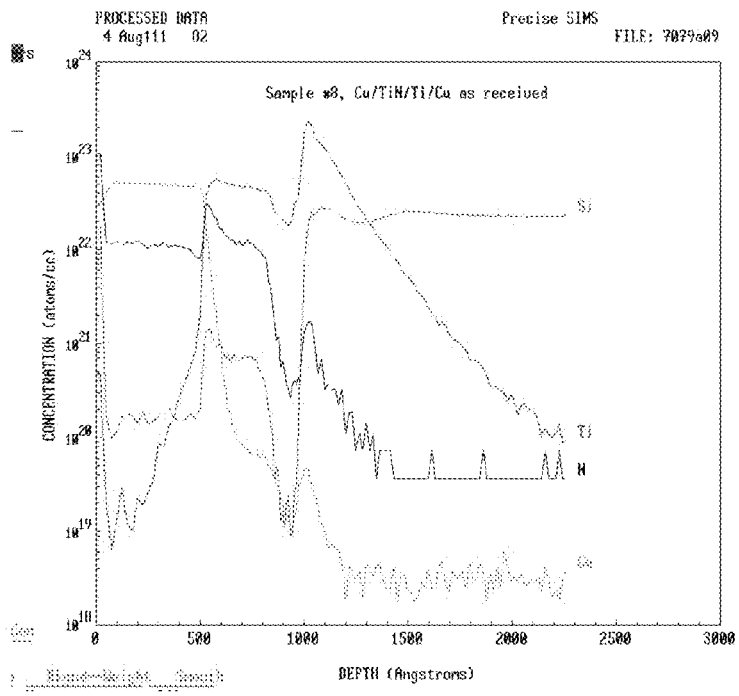
FIGS. 9A and 9B show precision secondary ion mass spectrometry for wafer 2, pre- and post-anneal, respectively.
Figure 9B:
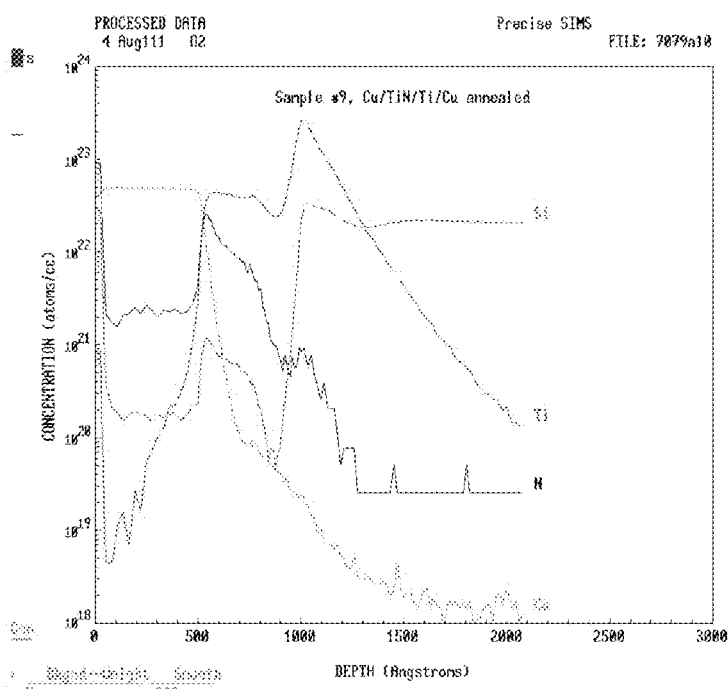

Secondary precision ion mass spectrometry was performed to determine the degree of copper incursion into the silicon wafers. FIGS. 6A and 6B show precision secondary ion mass spectrometry for wafer 4, pre- and post-anneal, respectively. FIGS. 7A and 7B show precision secondary ion mass spectrometry for wafer 3, pre- and post-anneal, respectively. FIGS. 8A and 8B show precision secondary ion mass spectrometry for wafer 5, pre- and post-anneal, respectively. FIGS. 9A and 9B show precision secondary ion mass spectrometry for wafer 2, pre- and post-anneal, respectively. As shown by the secondary ion mass spectrometry results, the diffusion barriers in wafers 2 and 5 best retained the copper ion profile and produced less knock on. These results are consistent with the visual analyses presented in Table 1.

Although the invention has been described with reference to the disclosed embodiments, those skilled in the art will readily appreciate that these are only illustrative of the invention. It should be understood that various modifications can be made without departing from the spirit of the invention. The invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

What is claimed is the following:

1. A method for forming a photovoltaic cell, the method comprising:
    applying an electrically conductive diffusion barrier directly onto a semiconductor substrate comprising an n-doped region and a p-doped region, the electrically conductive diffusion barrier limiting the passage of copper therethrough;
    wherein the electrically conductive diffusion barrier is selected from the group consisting of a metal nitride, a metal carbide, a metal boride, a metal tungstide, and any combination thereof;
    applying copper nanoparticles onto the electrically conductive diffusion barrier; and
    heating the copper nanoparticles to a temperature sufficient to at least partially fuse the copper nanoparticles together and form a bulk lattice of polycrystalline copper, thereby forming a copper contact on the electrically conductive diffusion barrier.

2. The method of claim 1, wherein the electrically conductive diffusion barrier and the copper contact are disposed on the n-doped region of the semiconductor substrate.

3. The method of claim 1, wherein the copper nanoparticles are applied to the electrically conductive diffusion barrier as a dispensible nanoparticle paste formulation comprising an organic matrix in which the copper nanoparticles are dispersed.

4. The method of claim 3, wherein at least a portion of the copper nanoparticles are about 20 nm in size or smaller.

5. The method of claim 3, wherein the dispensible nanoparticle paste formulation further comprises micron-scale copper particles, a conductive additive, a corrosion-resistant substance, or any combination thereof.

6. The method of claim 1, wherein the semiconductor substrate comprises a silicon substrate.

7. The method of claim 6, wherein the electrically conductive diffusion barrier is selected from the group consisting of TiN, TaN, WN, TiW, and any combination thereof.

8. The method of claim 7, wherein the electrically conductive diffusion barrier is directly applied to the semiconductor substrate by plating, physical vapor deposition, or chemical vapor deposition.

9. The method of claim 7, further comprising:
directly applying a plurality of nanoparticles to the semiconductor substrate; and
at least partially fusing the nanoparticles together to form the electrically conductive diffusion barrier.

10. The method of claim 1, further comprising:
adhering the semiconductor substrate to a surface while at least partially fusing the copper nanoparticles together.

11. The method of claim 1, wherein the copper contact is located on a face of the photovoltaic cell that receives electromagnetic radiation.

12. The method of claim 1, wherein the copper contact is located on a face of the photovoltaic cell opposite a face of the photovoltaic cell that receives electromagnetic radiation.

13. The method of claim 1, further comprising:
forming a corrosion-resistant coating on the copper contact, the corrosion-resistant coating comprising a corrosion-resistant substance.

14. The method of claim 13, wherein the corrosion-resistant substance is selected from the group consisting of a Sn coating, an Ag coating, a SnAgCu coating, an Al coating, a Si coating, a polymer coating, and any combination thereof.

15. The method of claim 1, wherein a conductive additive is mixed with the copper nanoparticles being formed into the copper contact.

16. The method of claim 15, wherein the conductive additive is selected from the group consisting of carbon black, pyrene, phenanthrene, carbon nanotubes, graphene, and any combination thereof.

17. The method of claim 1, wherein the copper nanoparticles comprise a surfactant layer overcoating a copper core.

18. A method for forming a photovoltaic cell, the method comprising:
applying an electrically conductive diffusion barrier onto a semiconductor substrate comprising an n-doped region and a p-doped region, the electrically conductive diffusion barrier limiting the passage of copper therethrough;
applying copper nanoparticles onto the electrically conductive diffusion barrier;
wherein the copper nanoparticles comprise a surfactant layer overcoating a copper core; and
heating the copper nanoparticles to a temperature sufficient to at least partially fuse the copper nanoparticles together and form a bulk lattice of polycrystalline copper, thereby forming a copper contact on the electrically conductive diffusion barrier.

* * * * *